(12) United States Patent
Zhang et al.

(10) Patent No.: US 6,538,488 B2
(45) Date of Patent: *Mar. 25, 2003

(54) CLOCK BUFFER CIRCUIT HAVING SHORT PROPAGATION DELAY

(75) Inventors: Johnny Q Zhang, San Jose, CA (US); David B Hollenbeck, Windsor, CO (US)

(73) Assignee: Hewlett-Packard Development Company, L.P., Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/426,874

(22) Filed: Oct. 26, 1999

(65) Prior Publication Data

US 2001/0043105 A1 Nov. 22, 2001

Related U.S. Application Data

(63) Continuation-in-part of application No. 09/064,999, filed on Apr. 23, 1998, now abandoned.

(51) Int. Cl.[7] .................................................. G06F 1/04
(52) U.S. Cl. ........................ 327/294; 327/299; 327/374
(58) Field of Search ................................ 327/291, 293, 327/294, 299, 374, 375, 376, 377, 165, 403, 404, 108, 261–264, 285; 326/17, 20

(56) References Cited

U.S. PATENT DOCUMENTS

| | | | |
|---|---|---|---|
| 4,612,466 A | * | 9/1986 | Stewart ........................ 327/437 |
| 4,985,643 A | | 1/1991 | Proebsting .................... 326/17 |
| 4,992,676 A | * | 2/1991 | Gerosa et al. ................. 326/27 |
| 5,061,864 A | | 10/1991 | Rogers ......................... 326/14 |
| 5,124,568 A | * | 6/1992 | Chen et al. ................... 327/217 |
| 5,149,990 A | | 9/1992 | Yamazaki et al. ............. 326/21 |
| 5,239,211 A | * | 8/1993 | Jinbo .......................... 326/27 |
| 5,512,854 A | * | 4/1996 | Park ............................ 327/374 |
| 5,519,344 A | | 5/1996 | Proebsting .................... 327/108 |
| 5,596,296 A | * | 1/1997 | Asazawa ...................... 327/291 |
| 5,610,548 A | * | 3/1997 | Masleid ....................... 327/374 |
| 5,675,273 A | * | 10/1997 | Masleid ....................... 327/156 |
| 5,717,343 A | * | 2/1998 | Kwong ........................ 326/27 |
| 5,760,620 A | * | 6/1998 | Doluca ........................ 327/112 |
| 5,760,634 A | * | 6/1998 | Fu ............................... 327/391 |
| 5,828,249 A | * | 10/1998 | Sessions ...................... 327/115 |
| 5,977,807 A | * | 11/1999 | Watanabe ..................... 327/175 |
| 6,040,713 A | * | 3/2000 | Porter et al. .................. 326/83 |
| 6,104,643 A | * | 8/2000 | Merritt ................... 365/189.05 |
| 6,236,237 B1 | * | 5/2001 | Wong et al. .................. 326/83 |

* cited by examiner

Primary Examiner—Timothy P. Callahan
Assistant Examiner—Hai L. Nguyen
(74) Attorney, Agent, or Firm—Jack A. Lenell

(57) ABSTRACT

A clock buffer circuit having a reduced propagation delay therethrough. The clock buffer circuit has a clock input for receiving an initial clock pulse thereto, and a clock output for transmitting a buffered clock pulse therethrough. A first driver chain arrangement of transistors is coupled with the clock input and the clock output for switching the buffered clock pulse from a low voltage level to a high voltage level. A second driver chain arrangement of transistors is coupled with the clock input and the clock output for switching the buffered clock pulse from the high voltage level to the low voltage level. A holder circuit and a first and trigger circuit for the second driver chain are also included.

25 Claims, 6 Drawing Sheets

CLOCK BUFFER CIRCUIT HAVING SHORT PROPAGATION DELAY

This application is a cont-in-part of Ser. No. 09/064,999 filed Apr. 23, 1998, ABN.

FIELD OF THE INVENTION

The invention generally relates to digital circuits, and more particularly relates to a clock buffer circuit having a short propagation delay.

BACKGROUND OF THE INVENTION

Along with the fulfillment of the promised performance and functionality of a Very Large Scale Integration (VLSI) digital integrated circuit chip, come new challenges. At the very heart of all synchronous digital systems are clock pulses. To maintain synchronization of numerous functional blocks fabricated at various locations on the VLSI chip, the clock pulses must be redistributed to each such functional block. To reduce clock loading and to increase clock driving strength, a number of clock buffer circuits are used.

Various clock buffer circuits are known in the prior art. FIG. 1A is a functional block diagram of a typical clock buffer circuit using a string of inverting amplifiers. FIG. 1B is an example schematic diagram for the circuit of FIG. 1A, showing an implementation using type n Field Effect transistors (nFETs) and type p Field Effect Transistors (pFETs).

While the clock buffer circuits of the prior art provide some advantages, some limitations still remain. Simulation predicts that for the prior art circuit in FIG. 1B, a propagation delay along an electrical path through the circuit from an input, clock_in, to an output, clock_out, is substantially longer than approximately one hundred and thirty picoseconds (when the circuit is fabricated using a 0.18 micron process and voltage swing of approximately one and a third volt are used.)

Such a long propagation delay through the clock buffer circuit of the prior art leads to other difficulties, such as increased power dissipation, as well as increased accumulated clock timing skew at the various locations on the VLSI chip due to processing, voltage and temperature variations.

What is needed is a clock buffer circuit having a reduced propagation delay therethrough relative to such prior art, so as to provide reduced accumulated clock timing skew and reduced power dissipation.

SUMMARY OF THE INVENTION

The invention provides a novel clock buffer circuit having a reduced propagation delay therethrough relative to the prior art discussed previously herein, so as to provide reduced accumulated clock timing skew and reduced power dissipation.

Briefly, and in general terms the clock buffer circuit of the invention has a clock input for receiving an initial clock pulse thereto, and a clock output for transmitting a buffered clock pulse therethrough. A first driver chain arrangement of transistors is coupled with the clock input and the clock output for switching the buffered clock pulse from a low voltage level to a high voltage level. A second driver chain arrangement of transistors is coupled with the clock input and the clock output for switching the buffered clock pulse from the high voltage level to the low voltage level.

The clock buffer circuit further includes a holder circuit coupled with the first and second driver chain and with the clock output for alternately holding the clock output at one of the high and low voltage levels. A trigger circuit for the first driver chain is coupled with the clock input for generating a first level trigger pulse in response thereto, and also is coupled with the first driver chain for applying the first level trigger pulse thereto. Similarly, a trigger circuit for the second driver chain is coupled with the clock input for generating a trigger pulse in response thereto, and also is coupled with the second driver chain for applying the trigger pulse thereto.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENT

Figure 1A:
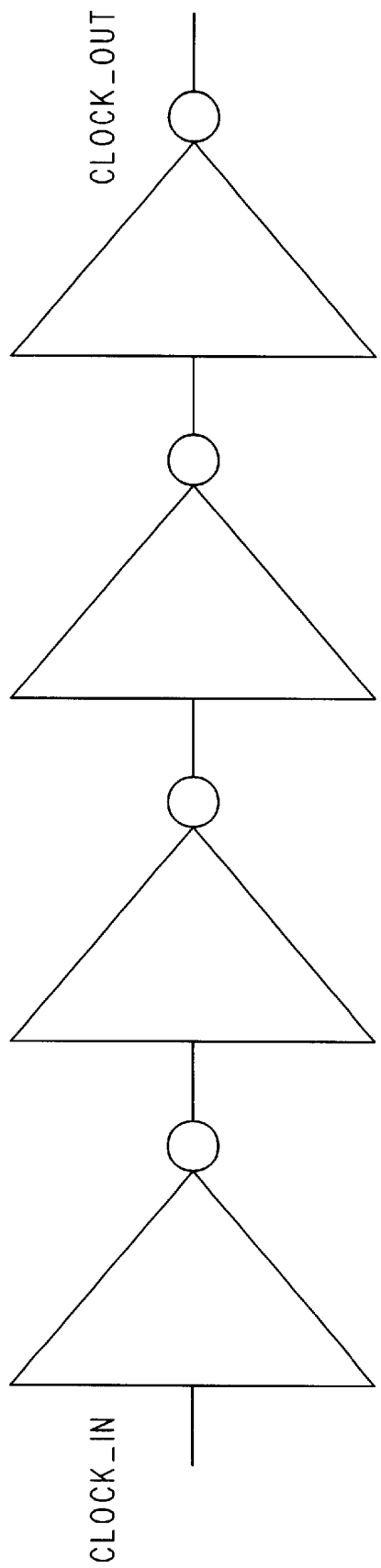
FIG. 1A is a functional block diagram of a clock buffer circuit of the prior art.
Figure 1B:
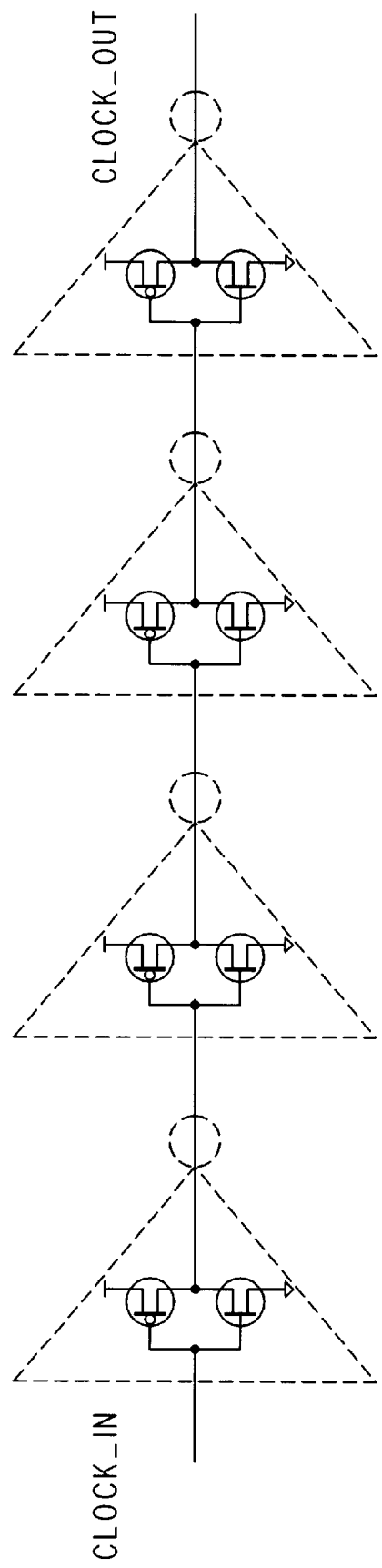
FIG. 1B is an example schematic diagram for the circuit of FIG. 1A.
Figure 2A:
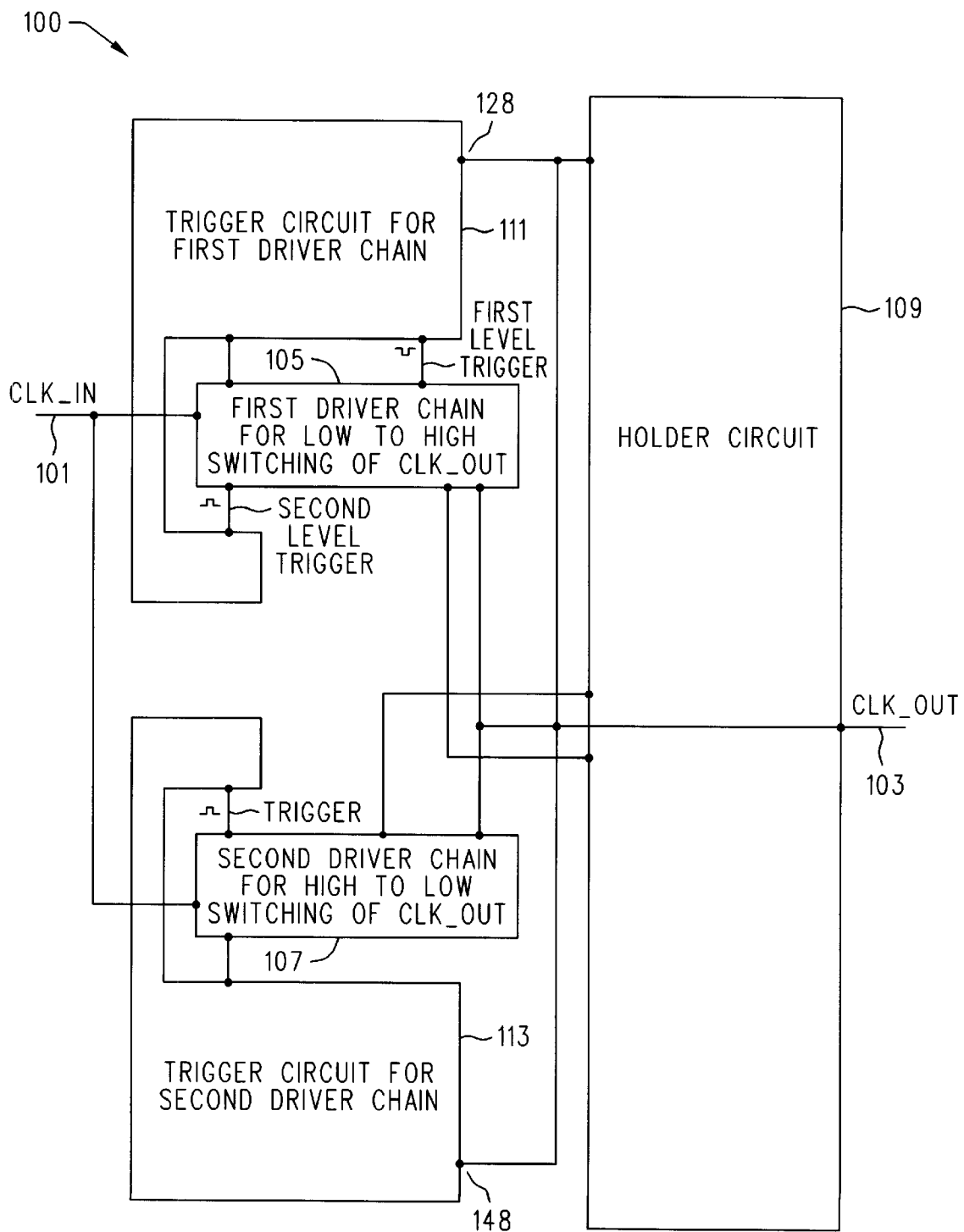
FIG. 2A shows a functional block diagram of a preferred embodiment of the invention.

FIG. 2A shows a functional block diagram of a preferred embodiment of the clock buffer circuit 100 of the invention. As shown, the clock buffer circuit of the invention has a clock input 101 for receiving an initial clock pulse, Clk_In, applied thereto and a clock output 103 for transmitting a buffered clock pulse, Clk_out, therethrough.

A first driver chain 105 arrangement of transistors is coupled with the clock input and the clock output for switching the buffered clock pulse from a low voltage level to a high voltage level. A second driver chain 107 arrangement of transistors is coupled with the clock input and the clock output for switching the buffered clock pulse from the high voltage level to the low voltage level.

As shown in FIG. 2A, the clock buffer circuit 100 further includes a holder circuit 109 coupled with the first and second driver chain and with the clock output. The holder circuit actively holds each one of the high and low voltage levels of the clock output for durations commensurate (and substantially equal) with durations of a respective one of the low or high voltage levels of the clock input (as durations of both the low and high voltage levels of the clock input are varied over a wide range, including up to desired arbitrarily long durations of both the low and high voltage levels of the clock input.)

Without such active holding contributed by the holder circuit, duration of one of the high or low voltage levels of the clock output could be quite substantially less than the durations the low and high voltage levels of the clock input (as durations of both the low and high voltage levels of the clock input are varied over the wide range, including up to desired arbitrarily long durations of both the low and high voltage levels of the clock input.)

Accordingly, it should be understood that the holder circuit substantially maintains a duty cycle of the clock output in relation to a duty cycle of the clock input (as durations of both the low and high voltage levels of the clock input are varied over a wide range, including up to desired arbitrarily long durations of both the low and high voltage levels of the clock input.)

Without such active maintenance by the holder circuit, the duty cycle of the the clock output could be quite substantially different than the duty cycle of the clock input (as durations of both the low and high voltage levels of the clock input are varied over the wide range, including up to desired arbitrarily long durations of both the low and high voltage levels of the clock input.)

A trigger circuit for the first driver chain 111 is coupled with the clock input. In response to a falling edge transition of the initial clock pulse (from the high voltage level to the low voltage level), the trigger circuit for the first driver chain 111 generates a rising edge transition (from the low voltage level to the high voltage level) in a first level trigger pulse for the first driver chain (which is coupled with the first driver chain for applying the first level trigger thereto.)

Then, in response to the rising edge transition of the first level trigger, the trigger circuit for the first driver chain 111 also generates a falling edge transition (from the high voltage level to the low voltage level) in a second level trigger pulse for the first driver chain (which is coupled with the first driver chain for applying the second level trigger thereto.) In response to the falling edge transition in the second level trigger pulse for the first driver chain, the first driver chain 105 causes a rising edge transition (from the low voltage level to the high voltage level) in the buffered clock output. The rising edge transition of the buffered clock output 103 is then fed back to the trigger circuit for the first driver chain at a first feedback input 128, so as to reset the first and second level triggers for the first driver chain.

Similarly, a trigger circuit for the second driver chain 113 is also coupled with the clock input. In response to a rising edge transition of the initial clock pulse (from the low voltage level to the a high voltage level), the trigger circuit for the second driver chain 113 generates a rising edge transition (from the low voltage level to the high voltage level) in a trigger pulse for the second driver chain (which is coupled with the second driver chain for applying such trigger thereto.) Then, in response to the rising edge transition in the trigger pulse for the second driver chain, the second driver chain 107 causes a falling edge transition (from the high voltage level to the low voltage level) in the buffered clock output. The falling edge transition of the buffered clock output 103 is then fed back to the trigger circuit for the second driver chain at the second feedback input 148, so as to reset the trigger of the second driver chain.

Figure 2B:
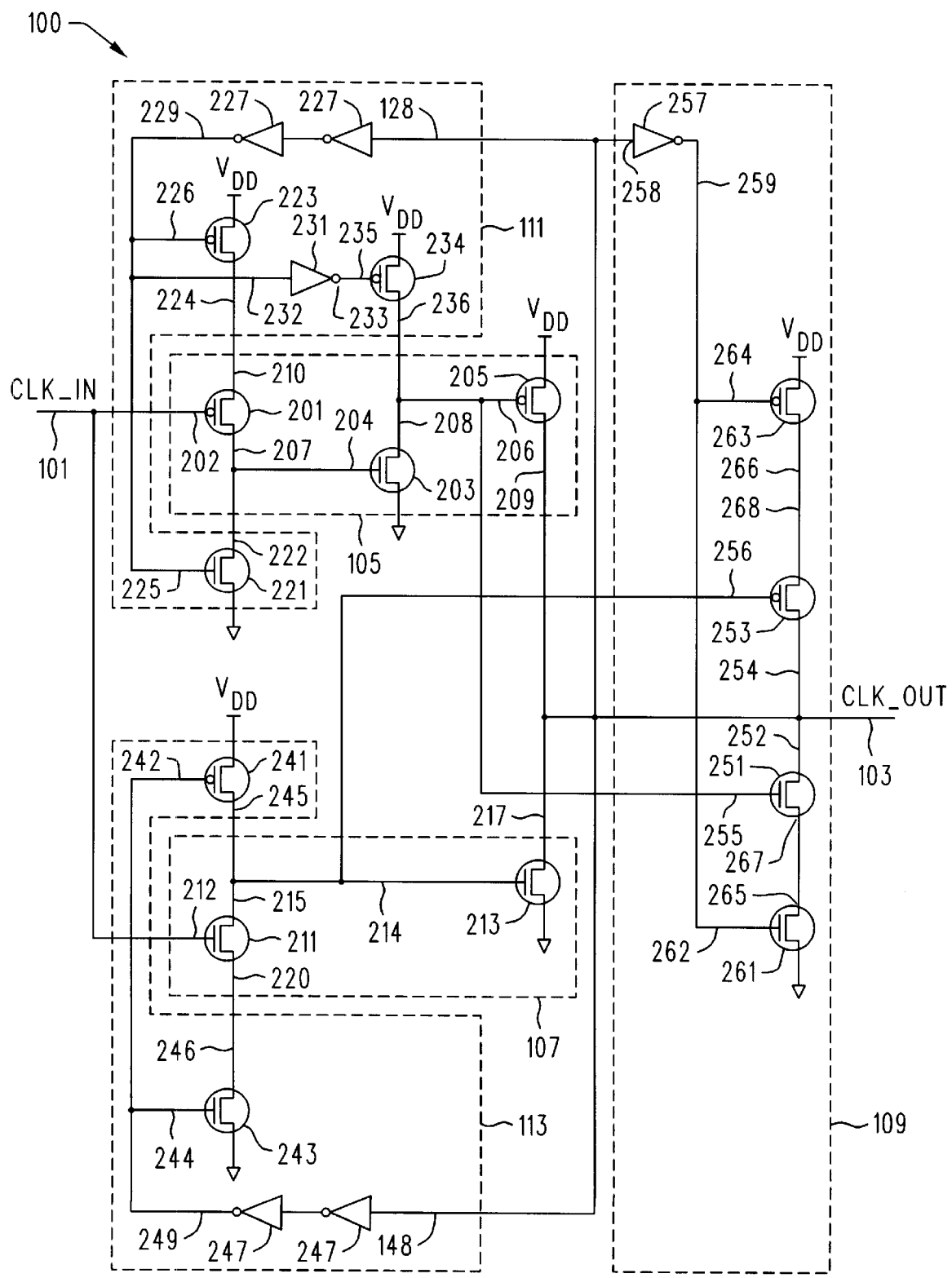
FIG. 2B is a schematic diagram illustrating a preferred implementation of the invention shown in FIG. 2A.

FIG. 2B is a schematic diagram illustrating a preferred implementation of the invention shown in FIG. 2A, using type n Field Effect transistors (nFETs) and type p Field Effect Transistors (pFETs). Preferably the invention is fabricated as an integrated circuit chip using 0.18 micron technology, in conjunction with other devices using techniques known to those with skill in the relevant art. As shown, the first driver chain 105 includes a first input transistor 201, a middle transistor 203, and a first output transistor 205, each having a respective gate 202, 204, 206 and a respective channel terminal 207, 208, 209.

The gate 202 of the first input transistor 201 is coupled with the clock input 101 of the clock buffer 100. The channel terminal 207 of the first input transistor 201 is coupled with the gate 204 of the middle transistor. The channel terminal 208 of the middle transistor 203 is coupled with the gate 206 of the first output transistor 205. The channel terminal 209 of the first output transistor 205 is coupled with the clock output 103 of the clock buffer 100.

Similarly, the second driver chain 107 includes a second input transistor 211 and a second output transistor 213 each having a respective gate 212, 214 and a respective channel terminal 215, 217. As shown, the gate 212 of the second input transistor 211 is coupled with the clock input 101 of the clock buffer 100. The channel terminal 215 of the second input transistor 211 is coupled with the gate 214 of the second output transistor 213. The channel terminal 217 of the second output transistor 213 is coupled with the clock output 103 of the clock buffer 100.

The first driver chain 105 arrangement of transistors includes a plurality of transistors of a first dopant type, which is p type in the preferred embodiment shown in FIG. 2B. In particular, the first input transistor 201 and the first output transistor 205 are each pFETs. This provides for effective operation of the first driver chain for low to high switching of the buffered clock output 103.

The second driver chain 107 arrangement of transistors includes a plurality of transistors of a second dopant type (that is complementary to the first dopant type). In the preferred embodiment, the second dopant type is n type. In particular, the second input transistor 211 and the second output transistor 213 are each nFETs. This provides for effective operation of the second driver chain for high to low switching of the buffered clock output 103.

Accordingly, it should be understood that the first driver chain 105 arrangement of transistors includes transistors predominantly of a first dopant type, and in the second driver chain 107 arrangement of transistors includes transistors predominantly of a second dopant type that is complementary to the first dopant type, for effective operation of the first and second driver chain.

As shown, a number of the transistors of the first dopant type of the first driver chain (two transistors in the preferred embodiment) substantially matches a number of the transistors of the second dopant type of the second driver chain (another two transistors in the preferred embodiment). This provides for advantageous symmetry of the Clk_Out signal at the buffered clock output 103.

The clock buffer 100 includes the trigger circuit for the first driver chain 111, which includes a first pair of trigger transistors 221, 223 that each have a respective channel terminal 222, 224. The channel terminal 222 of one member 221 of the first pair of trigger transistors is coupled with the channel terminal 207 of the first input transistor 201 of the first driver chain 105. The channel terminal 224 of another member 223 of the first pair of trigger transistors is coupled with another channel terminal 210 of the first input transistor 201 of the first driver chain 105.

The trigger circuit for the first driver chain 111 further includes a feedback chain arrangement of a first plurality of buffer amplifiers 227, wherein the chain includes the first feedback input 128 and further includes an output 229. In the preferred embodiment, the first plurality of buffer amplifiers advantageously provides approximately seventy picoseconds of delay, which is needed so that the first level trigger pulse for the first driver chain has a duration of approximately one hundred and fifty picoseconds, thereby providing for high speed operation of the clock buffer circuit. As shown, the first feedback input 128 is coupled with the clock output 103 of the clock buffer 100. The output of the feedback chain 229 is coupled with gates 225, 226 of the first pair of trigger transistors 221, 223.

The trigger circuit for the first driver chain further includes an additional buffer amplifier 231 having an input 232 and an output 233, and also includes an additional trigger transistor 234, which has a gate 235 and a channel terminal 236. The input 232 of the additional buffer 231 is coupled with the output 229 of the feedback chain. The output 233 of the additional buffer amplifier 231 is coupled with the gate 235 of the additional trigger transistor 234. The channel terminal 236 of the additional trigger transistor 234 is coupled with the channel terminal 208 of the middle transistor 203 and the gate 206 of the first output transistor 205 of the first driver chain 105, for applying the first level trigger pulse for the first driver chain thereto.

Similarly, the clock buffer circuit 100 includes the trigger circuit for the second driver chain 113. The trigger circuit for the second driver chain 113 includes a second pair of trigger transistors 241, 243 that each have a respective gate 242, 244 and a respective channel terminal 245, 246. The channel terminal 245 of one member 241 of the second pair of trigger transistors is coupled with the channel terminal 215 of the second input transistor 211 of the second driver chain 107, for applying the trigger pulse for the second driver chain thereto. The channel terminal 246 of another member 243 of the second pair of trigger transistors is coupled with another channel terminal 220 of the second input transistor 211 of the second driver chain 107.

The trigger circuit for the second driver chain 113 further includes a feedback chain arrangement of a second plurality of buffer amplifiers 247, wherein the chain includes the second feedback input 148 and further includes an output 249. In the preferred embodiment, the second plurality of buffer amplifiers provides the advantageous delay of approximately seventy picoseconds of delay, which is needed so that the trigger pulse for the second driver chain has a duration of approximately one hundred and fifty picoseconds, thereby providing for the high speed operation of the clock buffer circuit. The second feedback input 248 is coupled with the clock output 103 of the clock buffer 100. The output 249 of the feedback chain is coupled with gates 242, 244 of the second pair of trigger transistors.

The clock buffer 100 includes the holder circuit 109, which includes a pair of control transistors 251, 253 for controlling high voltage level and low voltage level state of the holder circuit. The pair of control transistors 251, 253 each have a respective channel terminal 252, 254 coupled with the clock output 103 of the clock buffer 100, and further have a respective gate 255, 256. The gate 255 of one member 251 of the pair of control transistors is coupled with the gate 206 of the first output transistor 205 of the first driver chain 105. The gate 256 of another member 253 of the pair of control transistors is coupled with the gate 214 of the second output transistor 213 of the second driver chain 107.

As shown in FIG. 2B, the holder circuit 109 further includes an inverting amplifier 257 having an input 258 and an output 259. The input 258 of the inverting amplifier 257 is coupled with the clock output 103 of the clock buffer 100.

The holder circuit 109 further includes a pair of holder transistors 261, 263 for holding each of the high and low voltage levels of the clock output 103. Each of the holder transistors have a respective gate 262, 264 coupled with the output 259 of the inverting amplifier 257, and further each have a respective channel terminal 265, 266. Another channel terminal 267 of the one member 251 of the pair of control transistors is coupled with the channel terminal 265 of one member 261 of the pair of holder transistors. Another channel terminal 268 of the other member 253 of the pair of control transistors is coupled with the channel terminal 266 of another member 263 of the pair of holder transistors.

An electrical path from the input of the clock buffer 100, through the clock buffer 100, to the buffered clock output 103 has a propagation delay. The propagation delay is a short propagation delay, substantially less than approximately one hundred and thirty picoseconds, so as to provide for efficient operation of the clock buffer circuit. Simulation models predict that in the preferred embodiment, the propagation delay is approximately one hundred and five picoseconds, when the clock buffer circuit is operated with a voltage swing of approximately one and one third volts at a temperature of one hundred and ten degrees centigrade. Simulation models predict that in the preferred embodiment, the propagation delay is approximately eighty picoseconds, when the clock buffer circuit is operated with a voltage swing of approximately one and one half volts at the temperature of one hundred and ten degrees centigrade.

Figure 3:
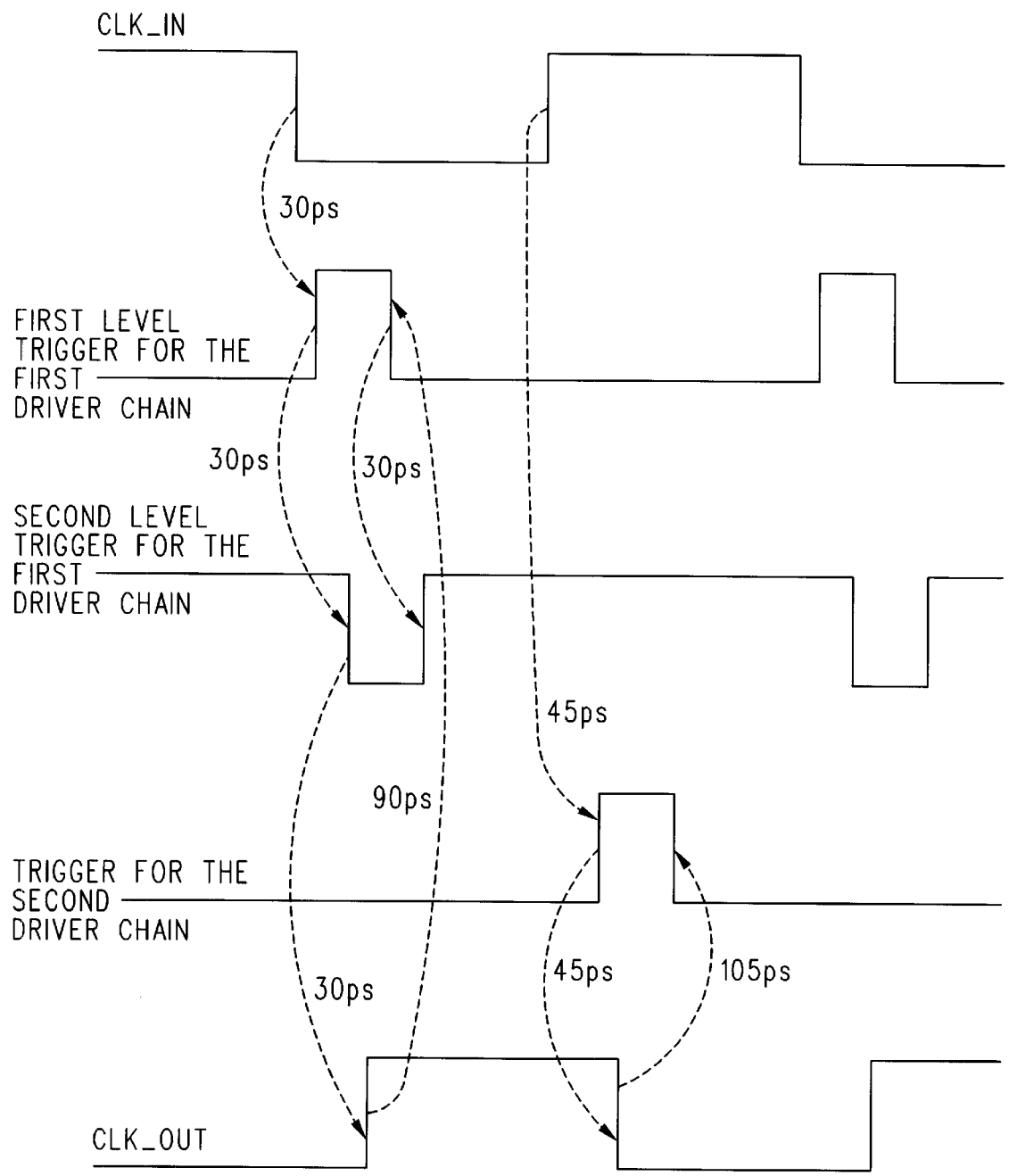
FIGS. 3 and 4 are timing diagrams illustrating operation of the invention.

FIG. 3 is a timing diagram illustrating operation of the invention. In the preferred embodiment the low voltage level, corresponding to a logical 0, is approximately zero volts, and the high voltage level, corresponding to a logical 1, is approximately one and one third volts.

Sequential operation of the preferred embodiment of the invention is illustrated in FIG. 3 using stippled arrows. In response to the falling edge transition of the initial clock pulse (from the high voltage level to the low voltage level), approximately thirty picoseconds later the trigger circuit for the first driver chain generates the rising edge transition (from the low voltage level to the high voltage level) in the first level trigger pulse for the first driver chain.

Then, in response to the rising edge transition of the first level trigger, approximately thirty picoseconds later, the trigger circuit for the first driver chain also generates the falling edge transition (from the high voltage level to the low voltage level) in the second level trigger pulse for the first driver chain. In response to the falling edge transition in the second level trigger pulse for the first driver chain, approximately thirty picoseconds later the first driver chain causes a rising edge transition (from the low voltage level to the high voltage level) in the buffered clock output.

Accordingly, in this example the propagation delay of the electrical path through the clock buffer of the invention is a desirable short propagation delay of only approximately ninety picoseconds, which advantageously provides for efficient operation of the clock buffer circuit of the invention.

The rising edge transition of the buffered clock output is fed back to the trigger circuit for the first driver chain, so as to reset the first and second level triggers for the first driver chain. More particularly, as illustrated in FIG. 3 using the stippled arrows, in response to the rising edge transition of the buffered clock pulse (from the low voltage level to the high voltage level), approximately ninety picoseconds later the trigger circuit for the first driver chain generates the falling edge transition (from the high voltage level to the low voltage level) in the first level trigger pulse for the first driver chain, as the first level trigger for the first driver chain is reset. Then, in response to the falling edge transition of the first level trigger, approximately thirty picoseconds later the trigger circuit for the first driver chain also generates the rising edge transition (from the low voltage level to the high voltage level) in the second level trigger pulse for the first driver chain, as the first level trigger for the first driver chain is reset.

Operation of the second driver chain and the trigger circuit for the second driver chain proceeds in a complimentary manner similar to the operation just discussed for first driver chain and the trigger circuit for the first driver chain. As illustrated in FIG. 3 using stippled arrows, in response to the rising edge transition of the initial clock pulse (from the low voltage level to the a high voltage level), approximately forty five picoseconds later the trigger circuit for the second driver chain generates a rising edge transition (from the low voltage level to the high voltage level) in the trigger pulse for the second driver chain. Then, in response to the rising edge transition in the trigger pulse for the second driver chain, approximately forty five picoseconds later the second driver chain causes the falling edge transition (from the high voltage level to the low voltage level) in the buffered clock output.

The falling edge transition of the buffered clock output is fed back to the trigger circuit for the second driver chain, so as to reset the trigger for the second driver chain. More particularly, as illustrated in FIG. 3 using the stippled arrows, in response to the falling edge transition of the buffered clock pulse (from the high voltage level to the low voltage level), approximately one hundred and five picoseconds later the trigger circuit for the second driver chain generates the falling edge transition (from the high voltage level to the low voltage level) in the trigger pulse for the second driver chain, as the trigger for the second driver chain is reset.

Figure 4:
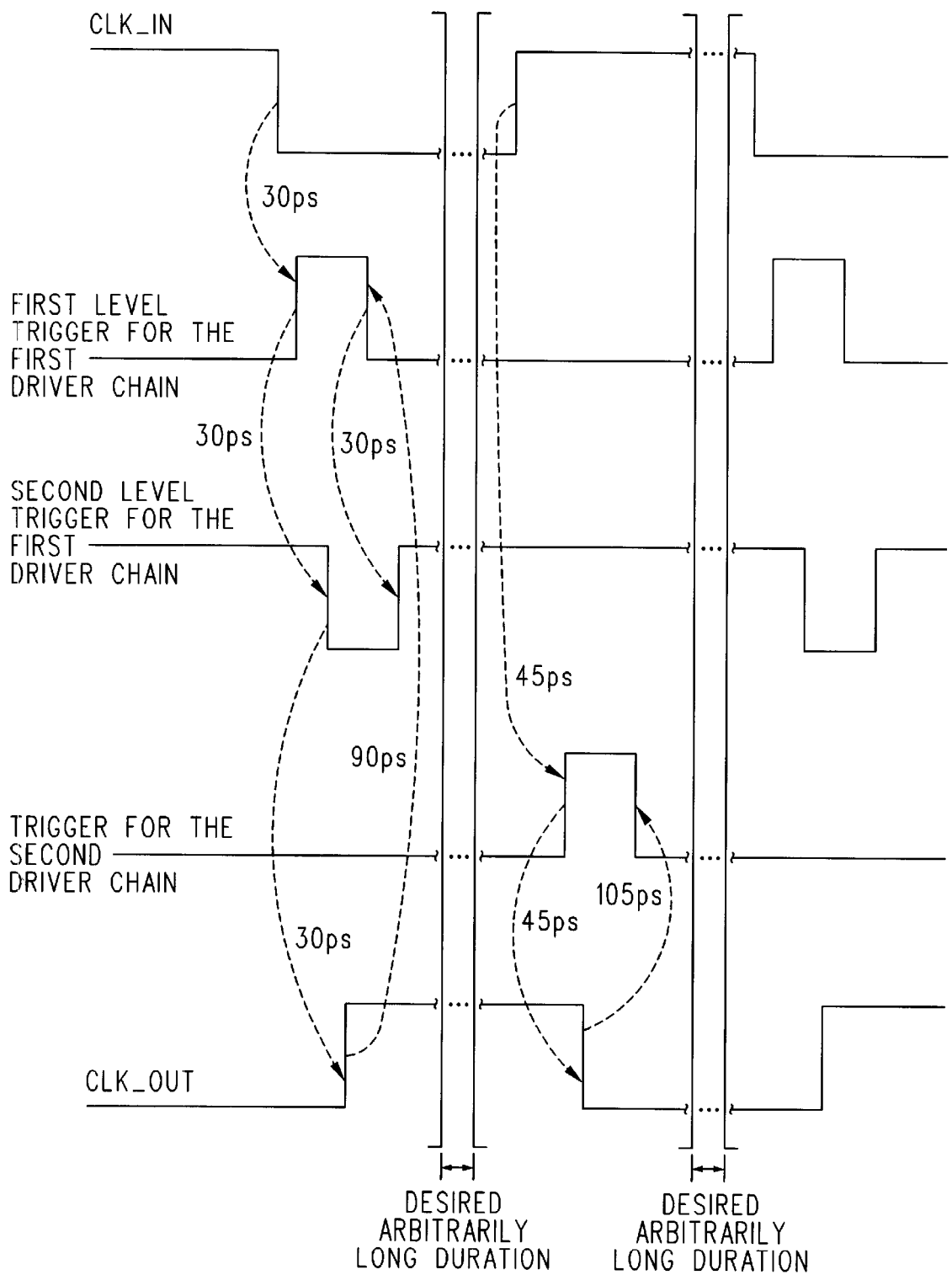

FIG. 4 is timing diagram generally similar to FIG. 2 that further illustrates operation of the invention. A duration of the first level trigger pulse for the first driver chain shown in FIGS. 3 and 4 is substantially shorter than a duration of the buffered clock pulse, so as to provide for the short propagation delay of the clock buffer circuit. The duration of the first level trigger pulse for the first driver chain shown in FIGS. 3 and 4 is substantially longer than one hundred and fifty picoseconds, so as to provide high speed switching of the buffered clock output from the low voltage level to the high voltage level. In the preferred embodiment, the duration of the first level trigger pulse for the first driver chain shown in FIGS. 3 and 4 is substantially less than approximately five hundred picoseconds.

Similarly, a duration of the trigger pulse for the second driver chain shown in FIGS. 3 and 4 is substantially shorter than a duration of the buffered clock pulse, so as to provide for the short propagation delay of the clock buffer circuit. The duration of the trigger pulse for the second driver chain shown in FIGS. 3 and 4 is substantially longer than one hundred and fifty picoseconds, so as to provide high speed switching of the buffered clock output from the high voltage level to the low voltage level. In the preferred embodiment, the duration of the trigger pulse for the second driver chain shown in FIGS. 3 and 4 is substantially less than approximately five hundred picoseconds.

To provide for advantageous symmetry in the buffered clock output, the durations of the first level trigger pulse for the first driver chain and the trigger pulse for the second driver chain shown in FIGS. 3 and 4 are approximately equal to one another.

In the preferred embodiment, the initial clock pulse and the buffered clock pulse, as shown in FIG. 3, each have a duration substantially less than approximately six hundred picoseconds, so as to provide advantageous high speed operation of digital circuits. However it should be understood that the invention is not strictly limited to such durations. For example as shown in FIG. 4 the invention provides beneficial results even as durations of both the low and high voltage levels of the clock input are varied over the wide range, including up to desired arbitrarily long durations of both the low and high voltage levels of the clock input.

In particular, as illustrated in each of FIGS. 3 and 4, the holder circuit actively holds each one of the high and low voltage levels of the clock output for durations commensurate (and substantially equal) with durations of a respective one of the low or high voltage levels of the clock input (as durations of both the low and high voltage levels of the clock input are varied over a wide range, including up to desired arbitrarily long durations of both the low and high voltage levels of the clock input.)

As illustrated in each of FIGS. 3 and 4, the holder circuit substantially maintains the duty cycle of the clock output in relation to the duty cycle of the clock input (as durations of both the low and high voltage levels of the clock input are varied over a wide range, including up to desired arbitrarily long durations of both the low and high voltage levels of the clock input.) For example, in each of FIGS. 3 and 4, the holder circuit substantially maintains the duty cycle of the clock output at an approximately fifty percent (50%) duty cycle in relation to the duty cycle of the clock input of approximately fifty percent (50%) (as durations of both the low and high voltage levels of the clock input are varied over a wide range, including up to desired arbitrarily long durations of both the low and high voltage levels of the clock input.

As discussed, the invention provides a novel clock buffer circuit having a reduced propagation delay therethrough. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefor, the invention may be practiced otherwise than as specifically described and illustrated.

What is claimed is:

1. An apparatus comprising:
    a clock buffer circuit, having a clock input for receiving an initial clock pulse applied thereto and a clock output for transmitting a buffered clock pulse therethrough, and including:
    a first driver chain of serial arrangement of transistors coupled with the clock input and the clock output for switching the buffered clock pulse from a low voltage level to a high voltage level;
    a second driver chain of serial arrangement of transistors coupled with the clock input and the clock output for switching the buffered clock pulse from the high voltage level to the low voltage level;
    respective trigger circuits for each of the first and second driver chains; and
    a holder circuit operable to alternately hold an output signal at one of the high or low output voltage levels; and
    a feedback path that couples the clock output to the inputs of the respective trigger circuits to reset the trigger circuits.

2. An apparatus as in claim 1 wherein:
    the holder circuit includes a pair of control transistors each having a respective channel terminal coupled with the clock output of the clock buffer, and having a respective gate;
    the gate of one member of the pair of control transistors is coupled with a gate of a first output transistor of the first driver chain; and
    the gate of another member of the pair of control transistors is coupled with a gate of a second output transistor of the second driver chain.

3. An apparatus as in claim 1 wherein:
the holder circuit includes an inverting amplifier having an input and an output;
the clock output of the clock buffer is fed back into the input of the inverting amplifier of the holder circuit;
the holder circuit includes a pair of holder transistors each having a respective gate coupled with the output of the inverting amplifier.

4. An apparatus an as in claim 1 wherein a duration of the buffered clock pulse is substantially less than approximately six hundred picoseconds.

5. An apparatus as in claim 1 wherein an electrical path from the input of the clock buffer, through the clock buffer, to the buffered clock output has a propagation delay, and the propagation delay is substantially less than approximately one hundred and thirty picoseconds.

6. An apparatus as in claim 1 wherein the holder circuit is adapted for holding each one of the high and low voltage levels of the clock output for durations commensurate with durations of a respective one of low or high voltage levels of the clock input, as durations of both the low and high voltage levels of the clock input are varied over a wide range, including up to desired arbitrarily long durations of both the low and high voltage levels of the clock input.

7. An apparatus as in claim 1 wherein the holder circuit is adapted for holding each one of the high and low voltage levels of the clock output for durations substantially equal with durations of a respective one of low or high voltage levels of the clock input, as durations of both the low and high voltage levels of the clock input are varied over a wide range, including up to desired arbitrarily long durations of both the low and high voltage levels of the clock input.

8. An apparatus as in claim 1 wherein the holder circuit substantially maintains the duty cycle of the clock output in relation to the duty cycle of the clock input, as durations of both the low and high voltage levels of the clock input are varied over a wide range, including up to desired arbitrarily long durations of both the low and high voltage levels of the clock input.

9. An apparatus as in claim 1 wherein:
the trigger circuit for the first drive chain is coupled with the clock input for generating a first level trigger pulse in response to the clock input; and
the trigger circuit for the first drive chain is coupled with the first driver chain for applying the first level trigger pulse to the first driver chain.

10. An apparatus as in claim 9 wherein the trigger circuit for the first driver chain is adapted for generating a second level trigger pulse in response to the first level trigger pulse.

11. An apparatus as in claim 10 wherein the trigger circuit for the first driver chain is coupled with the first driver chain for applying the second level trigger pulse thereto.

12. An apparatus as in claim 9 wherein the clock output is coupled for feeding back into the trigger circuit for the first driver chain, so as to reset the trigger circuit for the first driver chain.

13. An apparatus as in claim 9 wherein:
the trigger circuit for the second driver chain is coupled with the clock input for generating a trigger pulse in response to the clock input; and
the trigger circuit for the second driver chain is coupled with the second driver chain for applying the trigger pulse to the second driver chain.

14. An apparatus as in claim 13 wherein the clock output is coupled for feeding back into the trigger circuit for the second driver chain, so as to reset the trigger circuit for the second driver chain.

15. An apparatus as in claim 9 wherein a duration of the first level trigger pulse is substantially shorter than a duration of the buffered clock pulse.

16. An apparatus as in claim 9 wherein a duration of the first level trigger pulse is substantially less than approximately five hundred picoseconds.

17. An apparatus comprising:
a clock buffer circuit, having a clock input for receiving an initial clock pulse applied thereto and a clock output for transmitting a buffered clock pulse therethrough, and including:
a first driver chain of serial arrangement of transistors coupled with the clock input and the clock output for switching the buffered clock pulse from a low voltage level to a high voltage level;
a second driver chain of serial arrangement of transistors coupled with the clock input and the clock output for switching the buffered clock pulse from the high voltage level to the low voltage level
respective trigger circuits for each of the first and second driver chains; and
a holder feedback circuit coupled with the first and second driver chains and with the clock output for alternately holding the clock output at one of the high and low voltage levels, and including:
an inverting amplifier having an input and an output with the clock output of the clock buffer being fed back into the input of the inverting amplifier;
a pair of holder transistors each having a respective gate coupled with the output of the inverting amplifier, and having a respective channel terminal;
another channel terminal of the one member of the pair of control transistors is coupled with the channel terminal of one member of the pair of holder transistors; and
another channel terminal of the other member of the pair of control transistors is coupled with the channel terminal of another member of the pair of holder transistors.

18. An apparatus comprising:
a clock buffer circuit, having a clock input for receiving an initial clock pulse applied thereto and a clock output for transmitting a buffered clock pulse therethrough, and including:
a first driver chain of serial arrangement of transistors coupled with the clock input and the clock output for switching the buffered clock pulse from a low voltage level to a high voltage level;
a second driver chain of serial arrangement of transistors coupled with the clock input and the clock output for switching the buffered clock pulse from the high voltage level to the low voltage level;
respective trigger circuits for each of the first and second driver chains, wherein:
the trigger circuit for the first driver chain includes a first pair of trigger transistors that each have a respective channel terminal;
the channel terminal of one member of the first pair of trigger transistors is coupled with a channel terminal of a first input transistor of the first driver chain; and
the channel terminal of another member of the first pair of trigger transistors is coupled with another channel terminal of the first input transistor of the first driver chain;
a holder feedback circuit coupled with the first and second driver chains and with the clock output for alternately holding the clock output at one of the high and low voltage levels.

19. An apparatus as in claim 18 wherein:

the trigger circuit for the first driver chain further includes a feedback chain arrangement of a first plurality of buffer amplifiers, the chain having an input and an output;

the input of the feedback chain is coupled with the clock output of the clock buffer; and the output of the feedback chain is coupled with gates of the first pair of trigger transistors.

20. An apparatus as in claim 19 wherein:

the trigger circuit for the first driver chain further includes an additional buffer amplifier having an input and an output, and an additional trigger transistor having a gate and a channel terminal;

the input of the additional buffer is coupled with the output of the feedback chain;

the output of the additional buffer amplifier is coupled with the gate of the additional trigger transistor; and the channel terminal of the additional trigger transistor is coupled with a channel terminal of a middle transistor and a gate of a first output transistor of the first driver chain.

21. An apparatus comprising:

a clock buffer circuit, having a clock input for receiving an initial clock pulse applied thereto and a clock output for transmitting a buffered clock pulse therethrough, and including:

a first driver chain of serial arrangement of transistors coupled with the clock input and the clock output for switching the buffered clock pulse from a low voltage level to a high voltage level;

a second driver chain of serial arrangement of transistors coupled with the clock input and the clock output for switching the buffered clock pulse from the high voltage level to the low voltage level;

respective trigger circuits for each of the first and second driver chains, wherein:

the trigger circuit for the first drive chain is coupled with the clock input for, generating a first level trigger pulse in response to the clock input;

the trigger circuit for the first drive chain is coupled with the first driver chain for applying the first level trigger pulse to the first driver chain;

the trigger circuit for the second driver chain is coupled with the clock input for generating a trigger pulse in response to the clock input;

the trigger circuit for the second driver chain is coupled with the second driver chain for applying the trigger pulse to the second driver chain;

the trigger circuit for the second driver chain includes a second pair of trigger transistors that each have a respective gate and a respective channel terminal;

the channel terminal of one member of the second pair of trigger transistors is coupled with a channel terminal of a second input transistor of the second driver chain; and the channel terminal of another member of the second pair of trigger transistors is coupled with another channel terminal of a second input transistor of the second driver chain;

a holder feedback circuit coupled with the first and second driver chains and with the clock output for alternately holding the clock output at, one of the high and low voltage levels.

22. An apparatus as in claim 21 wherein:

the trigger circuit for the second driver chain further includes a feedback chain arrangement of a second plurality of buffer amplifiers, the chain having an input and an output;

the input of the feedback chain is coupled with the clock output of the clock buffer; and the output of the feedback chain is coupled with gates of the second pair of trigger transistors.

23. An apparatus comprising:

a clock buffer circuit, having a clock input for receiving an initial clock pulse applied thereto and a clock output for transmitting a buffered clock pulse therethrough, and including:

a first driver chain of serial arrangement of transistors coupled with the clock input and the clock output for switching the buffered clock pulse from a low voltage level to a high voltage level;

a second driver chain of serial arrangement of transistors coupled with the clock input and the clock output for switching the buffered clock pulse from the high voltage level to the low voltage level;

respective trigger circuits for each of the first and second driver chains; and a holder feedback circuit coupled with the first and second driver chains and with the clock output for alternately holding the clock output at one of the high and low voltage levels, and including:

a pair of control transistors each having a respective channel terminal coupled with the clock output of the clock buffer, and having a respective gate, wherein the gate of one member of the pair of control transistors is coupled with a gate of a first output transistor of the first driver chain and the gate of another member of the pair of control transistors is coupled with a gate of a second output transistor of the second driver chain;

an inverting amplifier having an input and an output wherein the clock output of the clock buffer is fed back into the input of the inverting amplifier;

a pair of holder transistors each having a respective gate coupled with the output of the inverting amplifier, and having a respective channel terminal;

another channel terminal of the one member of the pair of control transistors is coupled with the channel terminal of one member of the pair of holder transistors; and another channel terminal of the other member of the pair of control transistors is coupled with the channel terminal of another member of the pair of holder transistors.

24. An apparatus comprising:

a first driver chain of serial arrangement of transistors coupled with a clock input and a clock output;

a trigger circuit for the first driver chain coupled with the clock input;

a second driver chain of serial arrangement of transistors coupled with the clock input and the clock output;

a trigger circuit for the second driver chain coupled with the clock input; and a feedback circuit operable to alternately hold the clock output at high and low voltage levels; and a feedback path that couples the clock outputs to the inputs of the trigger circuits to reset the trigger circuits.

25. An apparatus comprising:

a clock buffer circuit, having a clock input for receiving an initial clock pulse applied thereto and a clock output for transmitting a buffered clock pulse therethrough, and including:
- a first driver chain of serial arrangement of transistors coupled with the clock input and the clock output for switching the buffered clock pulse from a low voltage level clock input to a high voltage level clock output;
- a second driver chain of serial arrangement of transistors coupled with the clock input and the clock output for switching the buffered clock pulse from a high voltage level clock input to a low voltage level clock output;
- respective trigger circuits for each of the first and second driver chains; and
- a holder circuit for alternately holding the clock output at one of the high and low voltage levels; and
- a feedback path that couples the clock output to the inputs of the respective trigger circuits to reset the trigger circuits.

\* \* \* \* \*